United States Patent
Kronholz et al.

(10) Patent No.: US 8,236,654 B2
(45) Date of Patent: Aug. 7, 2012

(54) REDUCTION OF THRESHOLD VOLTAGE VARIATION IN TRANSISTORS COMPRISING A CHANNEL SEMICONDUCTOR ALLOY BY REDUCING DEPOSITION NON-UNIFORMITIES

(75) Inventors: Stephan Kronholz, Dresden (DE); Andreas Ott, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 325 days.

(21) Appl. No.: 12/637,112

(22) Filed: Dec. 14, 2009

(65) Prior Publication Data
US 2010/0164014 A1 Jul. 1, 2010

(30) Foreign Application Priority Data
Dec. 31, 2008 (DE) .......................... 10 2008 063 402

(51) Int. Cl.
*H01L 21/8234* (2006.01)
*H01L 21/336* (2006.01)
(52) U.S. Cl. .......................... 438/275; 438/285; 438/289
(58) Field of Classification Search .................. 438/275, 438/285, 289
See application file for complete search history.

(56) References Cited

U.S. PATENT DOCUMENTS

| | | | |
|---|---|---|---|
| 7,217,608 B1 | 5/2007 | Xiang | 438/199 |
| 7,223,679 B2 * | 5/2007 | Murthy et al. | 438/592 |
| 7,598,142 B2 * | 10/2009 | Ranade et al. | 438/269 |
| 2005/0136624 A1 | 6/2005 | Cheng et al. | 438/478 |
| 2008/0079086 A1 | 4/2008 | Jung et al. | 257/369 |
| 2008/0111155 A1 | 5/2008 | Capasso et al. | 257/192 |

FOREIGN PATENT DOCUMENTS
WO WO 2005/067055 A1 7/2005
WO WO 2008/112949 A1 9/2008

OTHER PUBLICATIONS
Translation of Official Communication from German Patent Office for German Patent Application No. 10 2008 063 402.6-33 dated Mar. 29, 2010.

* cited by examiner

*Primary Examiner* — Luan C Thai
(74) *Attorney, Agent, or Firm* — Williams, Morgan & Amerson

(57) ABSTRACT

A threshold adjusting semiconductor material, such as a silicon/germanium alloy, may be provided selectively for one type of transistors on the basis of enhanced deposition uniformity. For this purpose, the semiconductor alloy may be deposited on the active regions of any transistors and may subsequently be patterned on the basis of a highly controllable patterning regime. Consequently, threshold variability may be reduced.

25 Claims, 9 Drawing Sheets

REDUCTION OF THRESHOLD VOLTAGE VARIATION IN TRANSISTORS COMPRISING A CHANNEL SEMICONDUCTOR ALLOY BY REDUCING DEPOSITION NON-UNIFORMITIES

BACKGROUND OF THE INVENTION

1. Field of the Invention

Generally, the present disclosure relates to sophisticated integrated circuits including advanced transistor elements that comprise highly capacitive gate structures including a metal-containing electrode and a high-k gate dielectric of increased permittivity compared to gate dielectrics, such as silicon dioxide and silicon nitride.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit elements that substantially determine performance of the integrated circuits. Generally, a plurality of process technologies are currently practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits is fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although, generally, usage of high speed transistor elements having an extremely short channel may be restricted to high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may no longer be compatible with requirements for performance driven circuits.

Therefore, replacing silicon dioxide, or at least a part thereof, as the material for gate insulation layers has been considered, particularly for extremely thin silicon dioxide gate layers. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has thus been suggested to replace silicon dioxide with high permittivity materials such as tantalum oxide ($Ta_2O_5$), with a k of approximately 25, strontium titanium oxide (SrTiO$_3$), having a k of approximately 150, hafnium oxide (HfO$_2$), HfSiO, zirconium oxide (ZrO$_2$) and the like.

When advancing to sophisticated gate architecture based on high-k dielectrics, additionally, transistor performance may also be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride, aluminum oxide and the like, may be formed so as to directly connect to the high-k dielectric material, thereby substantially avoiding the presence of a depletion zone. Since typically a low threshold voltage of the transistor, which represents the voltage at which a conductive channel forms in the channel region, is desired to obtain the high drive currents, commonly, the controllability of the respective channel requires sophisticated lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region to "reinforce" the resulting PN junction dopant gradient after the formation of respective extension and deep drain and source regions. In this way, the threshold voltage of the transistor significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll-off, and also reducing significant variations of transistor performance with a variation in gate length. Since the threshold voltage of the transistors is significantly affected by the work function of the gate material that is in contact with the gate dielectric material, an appropriate adjustment of the effective work function with respect to the conductivity type of the transistor under consideration has to be guaranteed.

For example, appropriate metal-containing gate electrode materials, such as titanium nitride, aluminum oxide and the like, may frequently be used, wherein the corresponding work function may be adjusted so as to be appropriate for one type of transistor, such as N-channel transistors, while P-channel transistors may require a different work function and thus a differently treated metal-containing electrode material in order to obtain the desired threshold voltage. In this case, complex and sophisticated manufacturing regimes may be required to provide different gate electrode materials in order to comply with the requirements of different transistor types. For this reason, it has also been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique, which may also present an additional complex process step, which, however, may provide reduced overall process complexity compared to the provision of the different metal-containing gate electrode materials or which may provide increased flexibility in obtaining appropriate transistor characteristics.

It turns out, however, that the manufacturing sequence for providing the threshold adjusting semiconductor alloy may have a significant influence on threshold variability across semiconductor die or substrates, as will be explained in more detail with reference to FIGS. 1a-1d.

FIG. 1a schematically illustrates a cross-sectional view of a semiconductor device 100 comprising a substrate 101, above which is formed a silicon-containing semiconductor material 103 having an appropriate thickness for forming therein and thereabove transistor elements. In the example shown, a buried insulating layer 102, for instance in the form of a silicon dioxide material, is positioned between the substrate 101 and the silicon-containing semiconductor layer 103. Moreover, an isolation structure 104, such as a shallow trench isolation, is formed in the semiconductor layer 103 so as to define a first crystalline "active" region 103A and a second active region 103B. In this context, an active region is to be understood as a semiconductor material in which an appropriate dopant profile is created so as to form PN junctions for one or more transistor elements. In the example shown, the first active region 103A may correspond to a P-channel transistor, while the second active region 103B may correspond to an N-channel transistor. Furthermore, a mask layer 105, for instance in the form of a silicon dioxide material and the like, may be formed so as to at least cover the first and second active regions 103A, 103B, while the isolation structure 104 may be exposed, depending on the process for forming the mask layer 105. Additionally, an etch mask 106 is provided, for instance in the form of a resist mask, which covers the second active region 103B and exposes the first active region 103A.

The semiconductor device 100 as illustrated in FIG. 1a may typically be formed on the basis of the following process techniques. First, the isolation structure 104 is formed on the basis of well-established lithography, etch, deposition, planarization and anneal techniques, in which, for instance, a trench is formed in the semiconductor layer 103 on the basis of a lithography process, which is subsequently to be filled with an appropriate insulating material, such as silicon dioxide, silicon nitride and the like. After removing excess material and planarizing the surface topography, further processing is typically continued by performing implantation sequences using an appropriate mask regime in order to introduce the corresponding dopant species for generating the basic dopant concentration in the active regions 103A, 103B corresponding to the type of transistors to be formed therein and thereabove. After activating the dopant species and re-crystallizing implantation-induced damage, further processing may be continued by forming the mask layer 105, for instance on the basis of an oxidation process and the like. Next, the resist mask 106 is formed by using lithography techniques in order to expose a portion of the mask layer 105 that is to be removed during the etch process 107, which may be performed as a wet chemical etch step using, for instance, hydrofluoric acid (HF), when the mask layer 105 is comprised of silicon dioxide. Furthermore, after removing the etch mask 106, the exposed surface area may be treated in order to prepare the first active region 103A for the selective deposition of a silicon/germanium alloy that is appropriately designed for adjusting the threshold voltage or band gap energy in combination with a metal-containing electrode material to be formed in a later manufacturing stage.

FIG. 1b schematically illustrates the semiconductor device 100 during a selective epitaxial growth process 108, in which process parameters are selected in accordance with well-established recipes such that significant material deposition may be restricted to the exposed active region 103A, while material deposition on dielectric surface areas may be negligible. Consequently, during the selective epitaxial growth process 108, a silicon/germanium alloy 109 may be selectively formed on the active region 103A, while a deposition thereof on the isolation structure 104 and on the mask layer 105 may be suppressed. For instance, in sophisticated applications, the silicon/germanium alloy 109 may be provided with a thickness of approximately 10 nm and less, while a germanium concentration may be approximately 25 atomic percent. It should be appreciated that the material composition of the silicon/germanium alloy 109, as well as the thickness thereof, may have a significant influence on the finally-obtained threshold voltage and thus on the finally-obtained transistor characteristics.

FIG. 1c schematically illustrates the semiconductor device 100 in a further advanced manufacturing stage. As illustrated, the device 100 is exposed to an etch ambient 112, for instance provided in the form of a wet chemical etch ambient, in which the mask layer 105 (FIG. 1b) is selectively removed with respect to material of the active region 103B and the previously-deposited silicon/germanium alloy 109. For instance, the etch process 112 is performed on the basis of hydrofluoric acid, which may remove silicon dioxide material with a high degree of selectivity with respect to the materials 103B and 109. Thereafter, further processing may be continued by forming gate electrode structures and completing the basic transistor configuration.

FIG. 1d schematically illustrates the semiconductor device 100 in an advanced manufacturing stage. In this stage, a P-channel transistor 150A is formed in and above the active region 103A and an N-channel transistor 150B is formed in and above the active region 103B. The transistors 150A, 150B both comprise a gate electrode structure 151 including a gate insulation layer 151B, comprising a high-k dielectric material, as previously explained. Furthermore, a metal-containing electrode material 151A, such as aluminum oxide, titanium nitride and the like, may be formed on the gate insulation layer 151B, followed by a further electrode material, such as polysilicon 151C. As illustrated, in the P-channel transistor 150A, the gate insulation layer 151B is formed on the silicon/germanium alloy 109 so that a threshold voltage of the transistor 150A, i.e., the voltage at which a conductive channel forms in a channel region 153, may be determined by the characteristics of the alloy 109 and the materials 151B and 151A, in combination with the corresponding characteristics of drain and source regions 154, which may also be formed on the basis of sophisticated dopant profiles, as previously explained. On the other hand, the band gap configuration of the channel region 153 of the transistor 150B is appropriate for the materials 151B, 151A.

The transistors 150A, 150B may be formed on the basis of well-established manufacturing techniques including the deposition of the gate insulation layers 151B, the electrode materials 151A and the polysilicon material 151C and the patterning thereof using sophisticated lithography and etch techniques. Thereafter, corresponding implantation sequences may be performed in combination with a manufacturing sequence for forming a spacer structure 152 in order to appropriately define the vertical and lateral dopant profile for the drain and source regions 154. After corresponding anneal processes for activating the dopants and re-crystallizing implantation-induced damage, the basic transistor configuration may be completed, if required, by forming metal silicide regions (not shown) in the drain and source regions 154 and the polysilicon material 151C.

Although the threshold voltage of the P-channel transistor 150A may be efficiently adjusted by providing the silicon/germanium alloy 109, a significant variability of the threshold voltages of P-channel transistors may be observed, in particular a significant deviation of the threshold voltage of P-channel transistors in densely packed device regions may be observed. Consequently, for sophisticated applications requiring highly-scaled transistor elements having a gate length of 50 nm and less, the conventional strategy for adjusting the threshold voltage of transistors comprising a sophisticated high-k metal gate electrode structure may be less than desirable due to the high threshold variability obtained in the conventional process flow.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which threshold variability of transistors including a threshold adjusting semiconductor alloy may be significantly reduced by reducing process non-uniformities during the deposition of the threshold adjusting semiconductor material. To this end, the degree of "pattern loading" during the epitaxial growth process for depositing the threshold adjusting semiconductor material may be reduced, thereby obtaining a high degree of uniformity across individual semiconductor die and also entire substrates. In this respect, the term "pattern loading" may be understood as the effect of variability of layer thickness and/or material composition during a deposition process depending on the "neighborhood" of the area, on which the corresponding material is to be deposited. That is, typically, the deposition behavior may depend on the local deposition conditions, which in turn may be determined by the neighborhood of a deposition area, wherein, in particular, a significant difference between densely packed device regions and non-densely packed device regions may be observed. Consequently, according to the principles disclosed herein, the corresponding local deposition conditions may be made more uniform by depositing the threshold adjusting material in a more "global" manner and patterning the same in a subsequent uniform and well-controllable patterning sequence.

One illustrative method disclosed herein comprises forming a layer of a silicon-containing semiconductor alloy on a first silicon-containing crystalline semiconductor region and a second silicon-containing crystalline semiconductor region. The method further comprises removing the layer of silicon-containing semiconductor alloy selectively from the second silicon-containing crystalline semiconductor region. Furthermore, the method comprises forming a first gate electrode structure of a first transistor on the layer of silicon-containing semiconductor alloy, wherein the first gate electrode structure comprises a high-k dielectric gate insulation layer and a metal-containing gate electrode material formed on the high-k dielectric gate insulation layer. Finally, the method comprises forming a second gate electrode structure of a second transistor above the second silicon-containing crystalline semiconductor region, wherein the second gate electrode structure comprises a high-k dielectric gate insulation layer and a metal-containing gate electrode material formed thereon.

A further illustrative method disclosed herein comprises forming a threshold adjusting semiconductor material on first and second silicon-containing semiconductor regions. Furthermore, a dopant species is introduced into the second silicon-containing semiconductor region by using an implantation mask that covers the first silicon-containing semiconductor region. The method further comprises removing the threshold adjusting semiconductor material selectively from the second silicon-containing semiconductor region on the basis of the implantation mask. Finally, the method comprises forming a first gate electrode structure of a first transistor on the threshold adjusting semiconductor material and a second gate electrode structure of a second transistor on the second silicon-containing semiconductor region, wherein the first and second gate electrode structures comprise a high-k dielectric material and a metal-containing electrode material formed on the high-k dielectric material.

One illustrative semiconductor device disclosed herein comprises a first device region comprising a plurality of densely packed first P-channel transistors that define a pitch of approximately 100 nm or less. Each of the first P-channel transistors is formed in and above a first silicon-containing semiconductor region and comprises a first layer of a threshold adjusting semiconductor alloy in a channel region of each of the first P-channel transistors. The semiconductor device further comprises a second device region comprising a plurality of second P-channel transistors that define a pitch of more than 100 nm, wherein each of the second P-channel transistors is formed in and above a second silicon-containing semiconductor region and comprises a second layer of the threshold adjusting semiconductor alloy in a channel region of each of the second P-channel transistors. Furthermore, a degree of uniformity of a material composition and/or a layer thickness of the first and second layers of the threshold adjusting semiconductor alloy is approximately ±2%.

BRIEF DESCRIPTION OF THE DRAWINGS

The disclosure may be understood by reference to the following description taken in conjunction with the accompanying drawings, in which like reference numerals identify like elements, and in which.

Figure 1A:
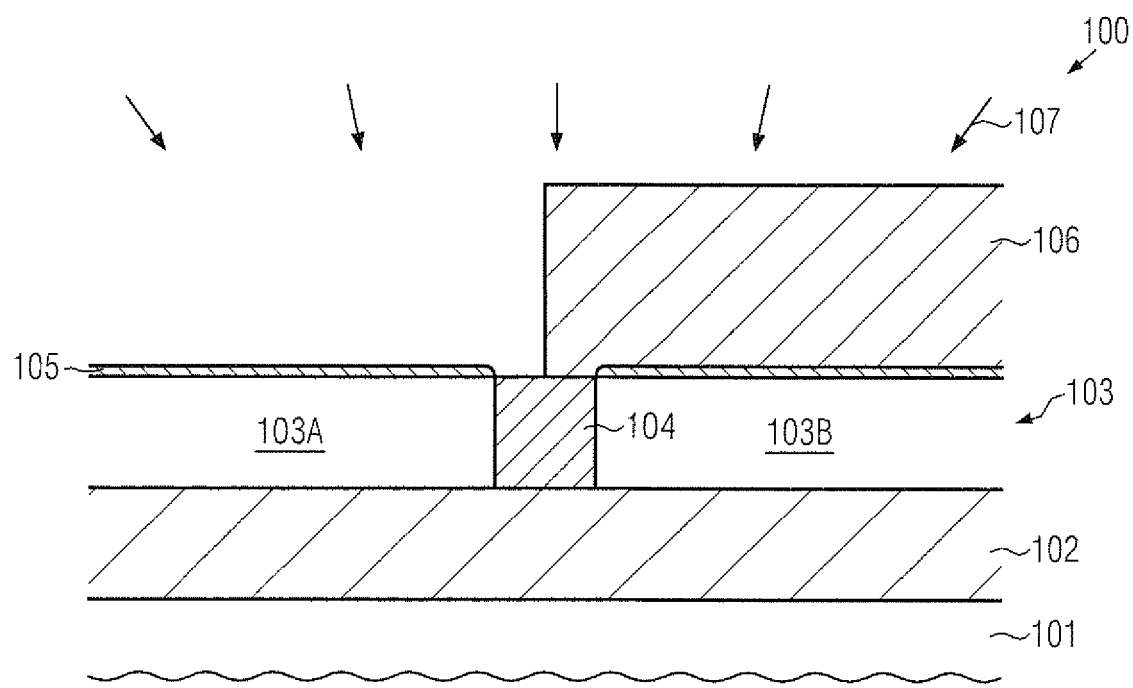
FIGS. 1a-1d schematically illustrate cross-sectional views of a sophisticated semiconductor device including a P-channel and an N-channel transistor during various manufacturing stages in providing a threshold adjusting silicon/germanium alloy according to conventional strategies.
Figure 1B:
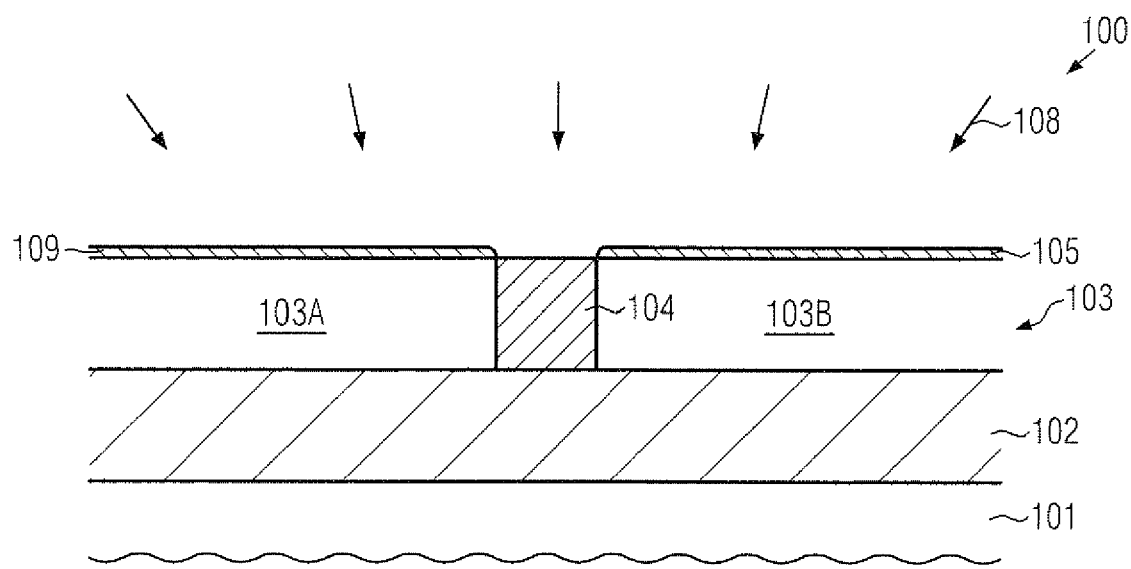

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and techniques in which sophisticated gate electrode structures may be formed in an early manufacturing stage on the basis of a high-k dielectric material and a metal containing electrode material. In this case, the threshold voltage of one type of transistors may be adjusted by providing an appropriate semiconductor material in the channel region of the corresponding transistor, which may be accomplished on the basis of a manufacturing process with enhanced uniformity, thereby reducing threshold variability, which may be caused by even small deviations in layer thickness and/or material composition of approximately ±5%. That is, as previously explained with reference to the semiconductor device 100, in conventional manufacturing strategies, the provision of a silicon/germanium alloy with a variability of approximately 5% with respect to layer thickness and/or germanium concentration with respect to a corresponding target value may result in significant threshold variations, which may not be compatible with requirements of sophisticated integrated circuits, in which transistors may be formed on the basis of critical dimensions of approximately 50 nm and less. It has been recognized that pattern-related non-uniformities during the deposition process for forming the threshold adjusting semiconductor alloy may have a significant influence on the resulting threshold variability, in particular with respect to device areas including densely packed transistor elements and device areas with a less critical packing density. Consequently, according to some illustrative embodiments, the critical epitaxial deposition process for forming the threshold adjusting semiconductor alloy may be performed on the basis of advanced surface conditions, i.e., with an increased degree of uniformity with respect to deposition surface areas and non-deposition areas so that the resulting degree of uniformity of the semiconductor alloy may be enhanced. In this respect, a degree of uniformity may be understood as a deviation of approximately ±3% of a given target value of the corresponding parameters. For example, the material composition of the threshold adjusting semiconductor material may vary by approximately 3% or less, i.e., ±3% compared to a target value, which may be defined as an average value taken from a large number of corresponding material samples. In other cases, the layer thickness may deviate by approximately ±3% or less with respect to the corresponding target thickness.

The enhanced degree of uniformity may, in some illustrative embodiments, be accomplished by depositing the threshold adjusting semiconductor alloy in a "non-selective" manner, wherein the semiconductor alloy may be deposited on active regions of any type of transistors and may subsequently be removed from one type of transistors, such as N-channel transistors, on the basis of a well-controllable etch process. It should be appreciated that the term "non-selective" deposition may also refer to cases in which, nevertheless, a degree of selectivity may be achieved between crystalline semiconductor surfaces and dielectric surface areas, which may be provided in the form of isolation structures and the like. Thus, even if a deposition of semiconductor alloy may be restricted to crystalline semiconductor surfaces, significantly improved deposition conditions may be achieved across the entire semiconductor die or the substrate including a plurality of semiconductor die, since, on a local scale, very similar deposition conditions may be achieved as typically both types of transistors may be positioned in close proximity, irrespective of whether densely packed or non-densely packed device regions are considered. In other illustrative embodiments, the isolation structures may be formed after depositing the semiconductor alloy in a highly non-selective manner, thereby even further enhancing uniformity of the deposition conditions. In some illustrative embodiments disclosed herein, the patterning of the semiconductor alloy may be accomplished without requiring an additional lithography step, thereby providing a highly efficient overall manufacturing flow.

Figure 1C:
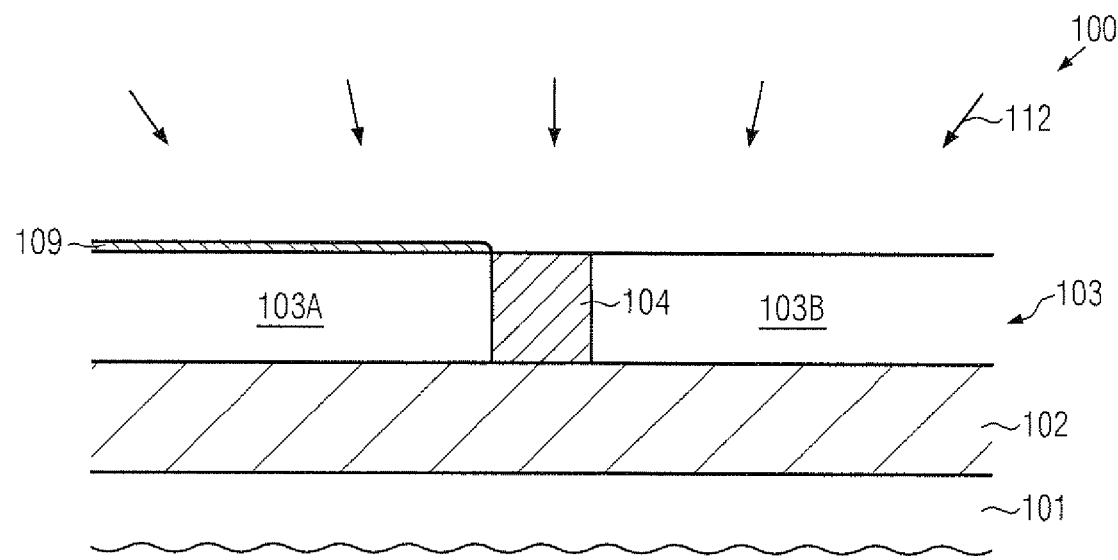
Figure 1D:
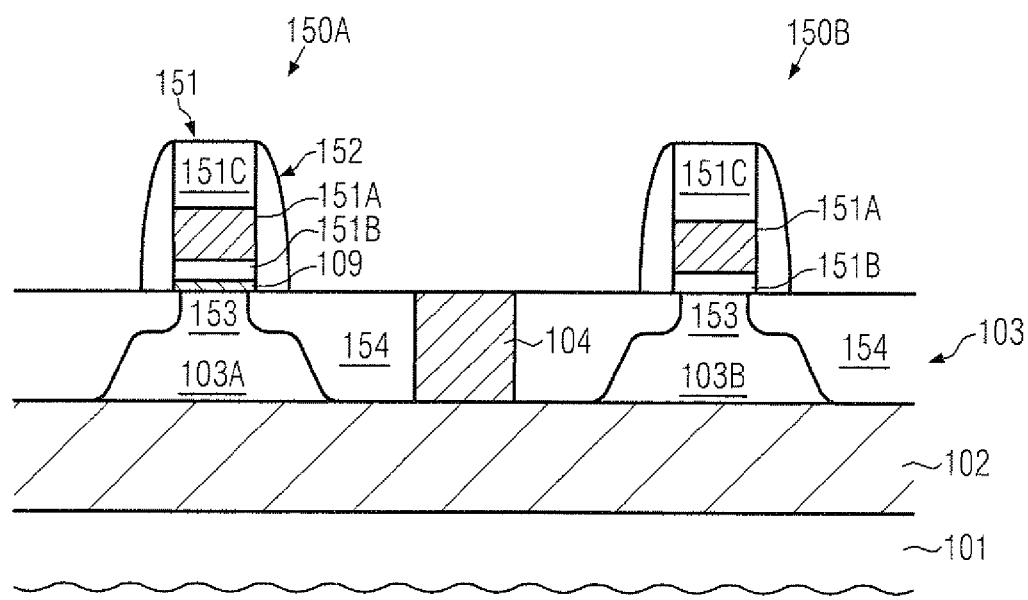
Figure 2A:
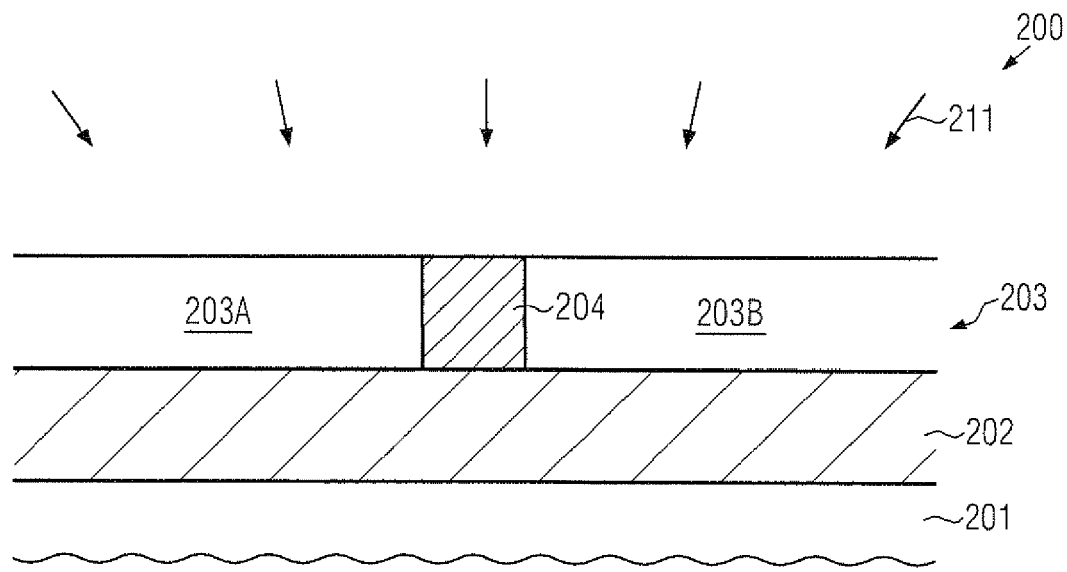
FIGS. 2a-2e schematically illustrate cross-sectional views of a semiconductor device during various manufacturing stages in selectively forming a threshold adjusting semiconductor alloy above a corresponding semiconductor region with enhanced uniformity, according to illustrative embodiments.

With reference to FIGS. 2a-2n, further illustrative embodiments will now be described in more detail, wherein reference may also be made to FIGS. 1a-1d, if required.

FIG. 2a schematically illustrates a cross-sectional view of a semiconductor device 200 comprising a substrate 201 and a silicon-containing semiconductor layer 203. Furthermore, in some illustrative embodiments, as is, for instance, shown in FIG. 2a, at least a portion of the device 200 may comprise an SOI architecture, in which a buried insulating layer 202 may be positioned between the substrate 201 and the silicon-containing semiconductor layer 203. It should be appreciated, however, that the principles disclosed herein may also be readily applied to "bulk" configurations, in which the buried insulating layer 202 may be omitted, at least in some device areas of the device 200. Furthermore, an isolation structure 204, such as a shallow trench isolation, may be provided in the semiconductor layer 203, thereby defining a first active region 203A and a second active region 203B. In the embodiment shown, the active regions 203A, 203B may comprise a basic doping for defining the conductivity type of corresponding transistors still to be formed in and above the active regions 203A, 203B. In one illustrative embodiment, the active region 203A may represent an N-doped region in order to form a P-channel transistor. Similarly, the active region 203B may represent the active region of an N-channel transistor. In the following, a manufacturing sequence will be discussed in which a threshold adjusting semiconductor alloy may be selectively formed on the active region 203A in order to provide a corresponding threshold voltage for the transistor to be formed therein. It should be appreciated, however, that corresponding mechanisms for adjusting the threshold voltage may be applied to the transistor to be formed in the active region 203B or to both transistors, depending on the overall device and process requirements.

Furthermore, with respect to the components described so far and with respect to any manufacturing techniques for forming the same, the same criteria may apply as previously explained with reference to the semiconductor device 100. In the embodiment shown, after forming the isolation structure 204 and defining the basic doping in the active regions 203A, 203B, the device 200 may be subjected to a cleaning process 211, which may be performed on the basis of well-established wet chemical recipes. For example, any native oxides may be removed which may have formed during the preceding manufacturing steps.

Figure 2B:
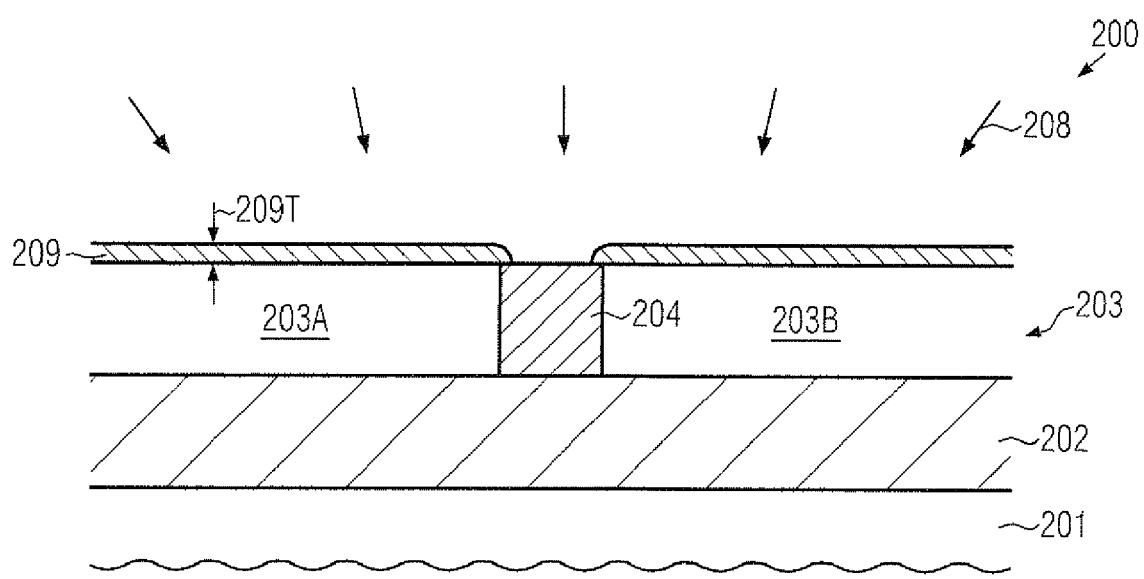

FIG. 2b schematically illustrates the semiconductor device 200 during an epitaxial growth process 208, in which a semiconductor alloy 209, for instance in the form of a silicon/germanium material and the like, may be deposited on the basis of surface conditions of enhanced uniformity compared to conventional strategies. That is, in one illustrative embodiment, the epitaxial growth process 208 may be performed on the basis of well-established process parameters, such as a "selective" deposition recipe, in which material adhesion may occur substantially on exposed crystalline surface areas, such as the regions 203A, 203B, while a pronounced material deposition on dielectric surface areas, such as the isolation structure 204, may be suppressed. In this sense, the process 208 may be referred to as a selective epitaxial growth process, wherein, however, the semiconductor alloy 209 may be formed in a non-selective manner with respect to the active regions 203A, 203B. That is, contrary to the conventional approach, the deposition rate and/or the presence of any precursor materials immediately at the surface areas of the regions 203A, 203B may be very similar even for the entire substrate 201, since the local neighborhood for the deposition on the active region 203A may be similar irrespective of the overall packing density in a corresponding device region, since typically one or more further transistor elements or active regions are positioned in close proximity to the region 203A, such as the region 203B, over which a deposition of the material 209 is conventionally suppressed. Consequently, the corresponding "edge conditions" may be similar for any of the active regions corresponding to the transistor type, for which the deposition of the material 209 is required. Consequently, a thickness 209T of the material 209 may have a high degree of uniformity and may vary by approximately ±3% or less compared to the corresponding representative average value taken across the entire substrate 201. In other illustrative embodiments, the thickness variability may even be approximately 2% and less. For instance, the semiconductor alloy 209 may represent a silicon/germanium alloy having a thickness of approximately 10 nm and less, for instance 9 nm, while a germanium concentration may be approximately 25 atomic % and less, depending on the desired band gap offset to be provided in combination with a corresponding metal-containing electrode material. Thus, due to the enhanced uniformity of the gas flow during the deposition process 208, the variability of the material composition may be enhanced, i.e., the variability of the fraction of the various components, such as silicon, germanium and the like, depending on the type of semiconductor alloy 209 used, may be reduced and may be within approximately ±3% or less relative to a representative mean value or target value.

Figure 2C:
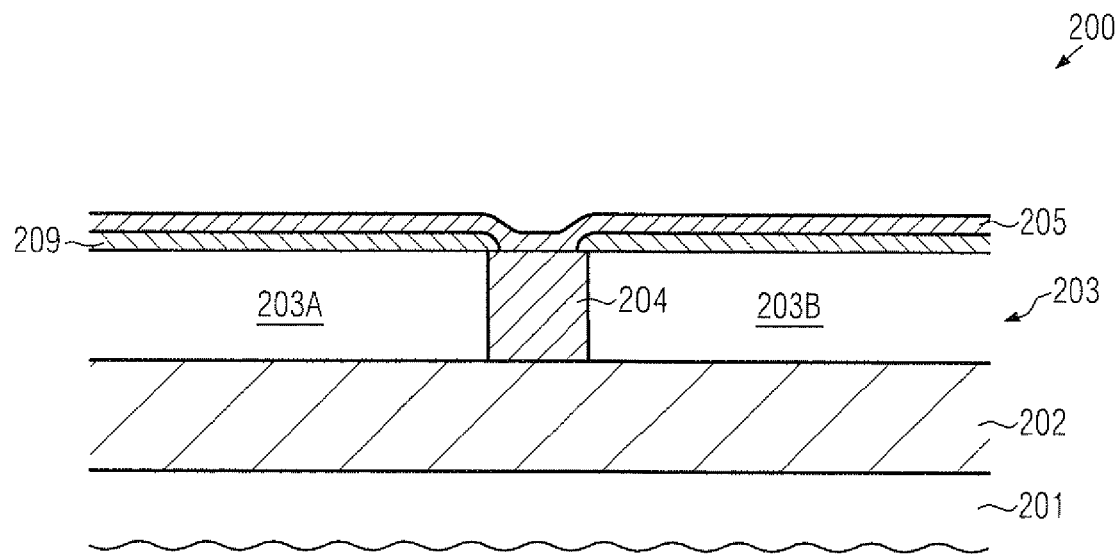

FIG. 2c schematically illustrates a cross-sectional view of the semiconductor device 200 in a further advanced manufacturing stage. As illustrated, a mask layer 205 is formed on the semiconductor layer 209 and may be comprised of any appropriate material, such as silicon dioxide, silicon nitride and the like. In some illustrative embodiments, the mask layer 205 may be formed of an oxide of the material 209 and hence corresponding components may also be contained in the mask layer 205. The layer 205 may be formed on the basis of well-established deposition techniques, such as plasma-assisted chemical vapor deposition (CVD), thermally activated CVD and the like. In other cases, an oxidation process may be performed, for instance a thermal oxidation, a plasma-assisted oxidation, a wet chemical oxidation and the like, wherein a high degree of controllability of the corresponding oxidation process may enable precise control of material consumption of the initial layer 209. That is, due to the well-known and stable oxidation rates for a plurality of oxidation recipes, the degree of material consumption may be determined in advance and may be taken into consideration upon depositing the layer 209 with an appropriate initial thickness. Due to the high degree of uniformity of corresponding oxidation processes, the oxidation of the mask layer 205 on the basis of these oxidation processes may not substantially contribute to additional overall process non-uniformity.

Figure 2D:
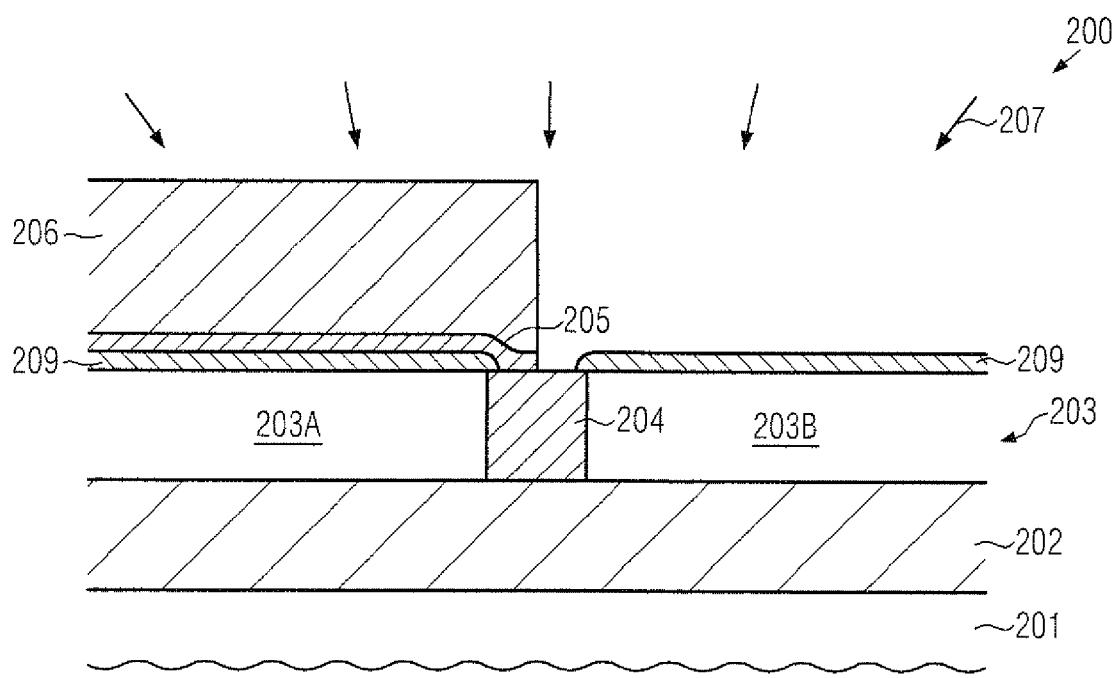

FIG. 2d schematically illustrates the semiconductor device 200 in a manufacturing stage in which a mask 206 may be provided to cover the active region 203A and the corresponding material layers 209 and 205 formed thereon, while exposing the active region 203B and the corresponding materials formed thereon to an etch ambient 207 that is designed to remove material of at least the mask layer 205. In the embodiment shown, the etch process 207 may be performed to selectively remove the material 205 with respect to the material 209, which may be accomplished, for instance, on the basis of hydrofluoric acid, when the mask layer 205 is comprised of silicon dioxide. In other cases, any other selective etch recipe may be used in order to selectively remove the exposed portion of the layer 205.

Figure 2E:
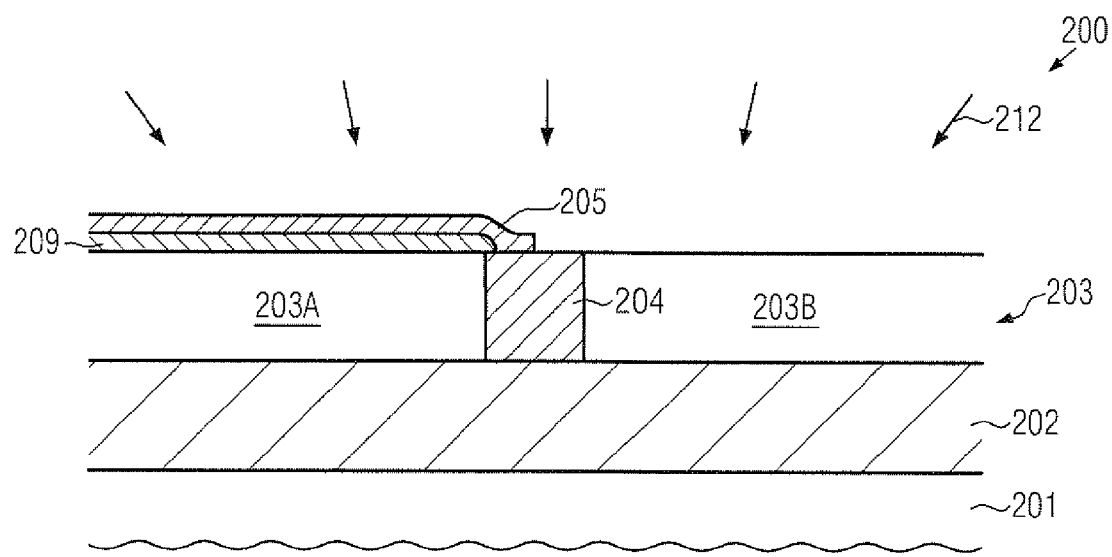

FIG. 2e schematically illustrates the semiconductor device 200 when exposed to a further etch ambient 212, which may be established on the basis of an appropriate etch chemistry for removing material of the layer 209 selectively with respect to at least the mask layer 205. In one illustrative embodiment, the etch process 212 may be performed as a wet chemical etch process on the basis of a chemical agent that enables the removal of the material 209, such as a silicon/germanium alloy, selectively to the mask layer 205 that may be comprised of silicon dioxide, silicon nitride and the like. During the etch process 212, process parameters, such as concentration of chemical agents, process time and the like, may be appropriately selected so as to not unduly consume material of the active region 203B. In one illustrative embodiment, the etch process 212 may be performed on the basis of tetramethyl ammonium hydroxide (TMAH), which is a well-known chemical for removing resist material, which, however, may also efficiently remove silicon-based materials when provided in higher concentrations and at elevated temperatures. Furthermore, TMAH may also exhibit a pronounced selectivity with respect to silicon dioxide and silicon nitride material. Consequently, the layer 209 may be removed with a high degree of controllability without compromising integrity of the material layer 209 above the active region 203A, even if the resist mask 206 (FIG. 2d) may be removed during the etch process 212. In other cases, the resist mask may be removed prior to initiating the etch process 212 in order to further enhance overall process uniformity. Consequently, the overall integrity of the material 209 during the patterning sequence for exposing the action region 203B may be maintained on the basis of the mask layer 205. Thereafter, the mask layer 205 may be removed from above the active region 203A, wherein similar process techniques may be applied as previously explained with reference to the semiconductor device 100 when referring to the etch process 110 (FIG. 1c). After exposing the semiconductor alloy 209, further processing may be continued on the basis of well-established process techniques for forming sophisticated gate electrode structures, as previously explained.

Figure 2F:
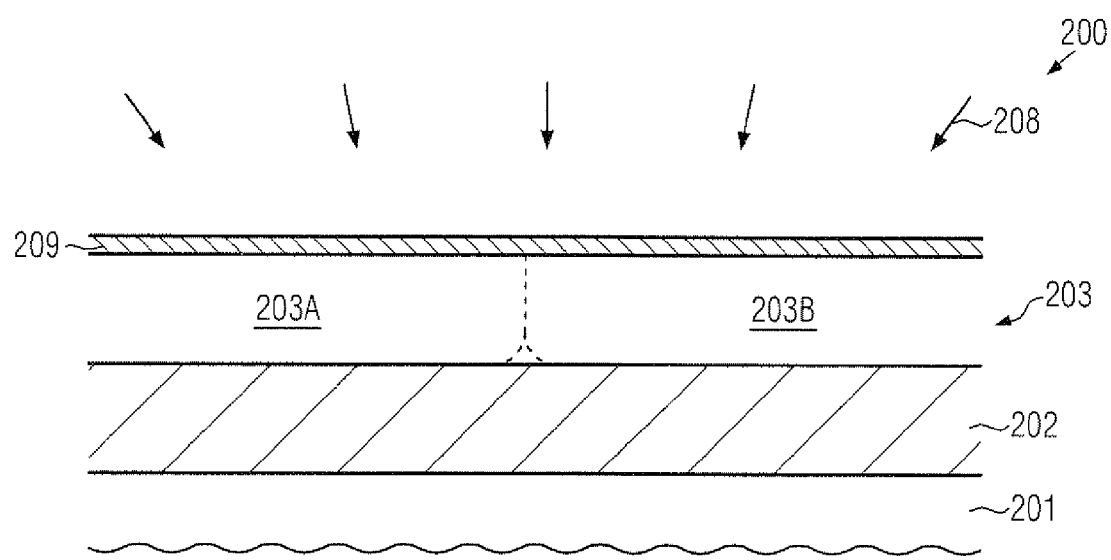
FIG. 2f schematically illustrates a cross-sectional view of a semiconductor device in which a threshold adjusting semiconductor alloy may be formed prior to forming corresponding isolation structures, according to further illustrative embodiments.

FIG. 2f schematically illustrates the semiconductor device 200 according to further illustrative embodiments in which the basic doping for the regions 203A, 203B may have been established prior to forming an isolation structure. Furthermore, the device 200 may be exposed to the epitaxial growth process 208 in order to form the semiconductor alloy 209 on the basis of any appropriate deposition recipe, wherein a further enhanced degree of deposition conditions may be achieved due to the missing isolation structures. Consequently, in this case, the material 209 may be provided with a high degree of uniformity with respect to material composition and layer thickness, as previously explained. After forming the semiconductor alloy 209, further processing may be continued by patterning the layer 209 and forming isolation structures, wherein appropriate manufacturing strategies for maintaining enhanced process uniformity may be described later on with reference to FIG. 2l.

With reference to FIGS. 2g-2j, further illustrative embodiments will now be described, in which the patterning of the threshold adjusting semiconductor alloy may be accomplished on the basis of an implantation mask that is used for defining the basic dopant concentration in one of the active regions.

Figure 2G:
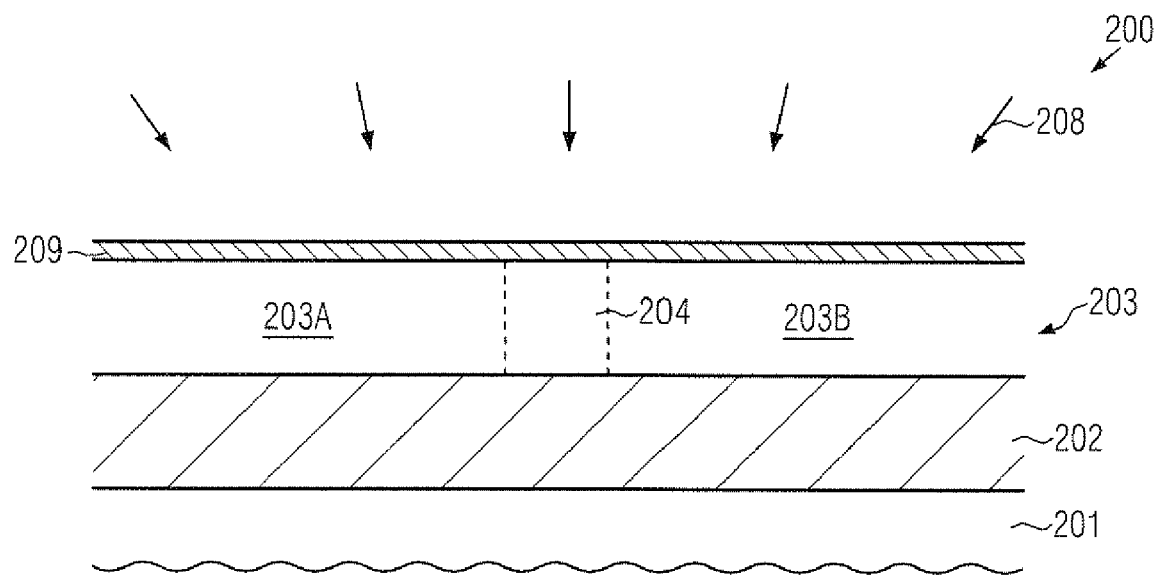
FIGS. 2g-2k schematically illustrate cross-sectional views of a semiconductor device during various manufacturing stages, in which the threshold adjusting semiconductor alloy may be formed on the basis of an implantation mask used for defining the basic doping in an active region, according to illustrative embodiments.

FIG. 2g schematically illustrates the semiconductor device 200 in a manufacturing stage in which, in one illustrative embodiment, the isolation structure 204 may be formed so as to separate the active regions 203A, 203B, while, however, a corresponding basic doping level may not be established yet.

In other illustrative embodiments, the isolation structure 204 may not be formed in this manufacturing stage, as indicated by the dashed lines, and may be formed in a later manufacturing stage, as previously explained with reference to FIG. 2f and as will also be explained in more detail with reference to FIG. 2l. Moreover, the device 200 is exposed to the deposition ambient of the process 208 so as to form the semiconductor alloy 209 with superior uniformity, as is previously explained. It should be appreciated that the semiconductor alloy 209 may not be formed above the isolation structure 204, if already present in this manufacturing stage.

Figure 2H:
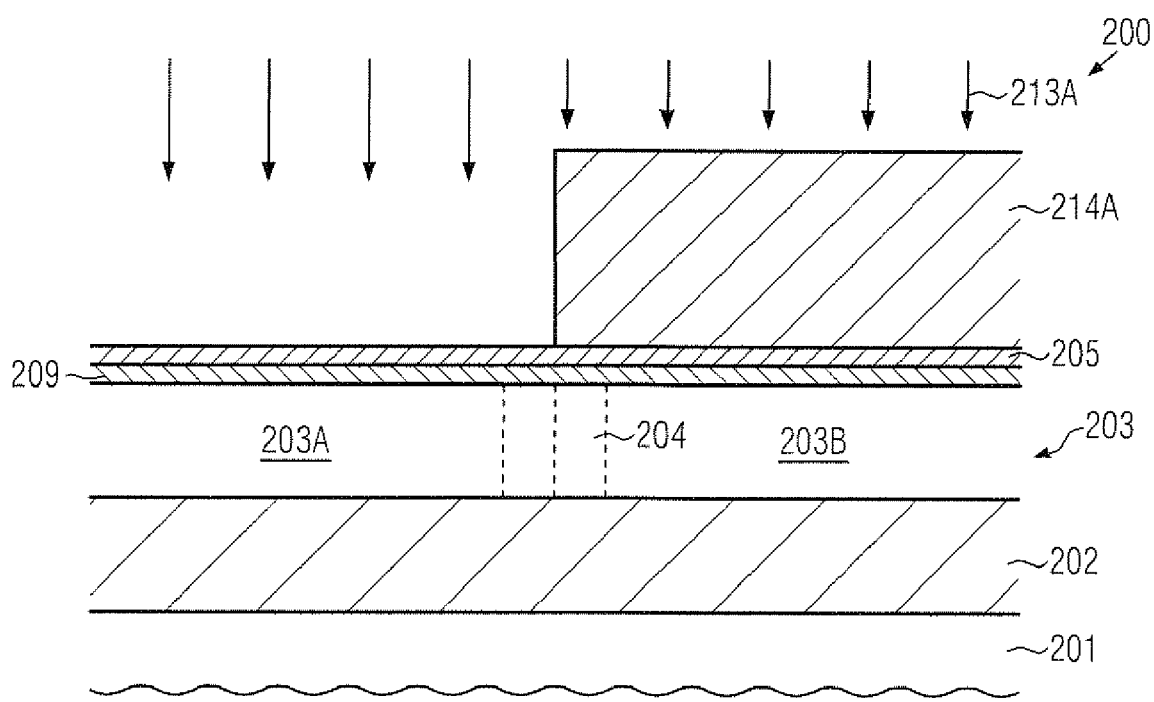

FIG. 2h schematically illustrates the semiconductor device 200 in a further advanced manufacturing stage. As illustrated, the mask layer 205 may be formed on the semiconductor alloy 209, wherein the mask layer 205 may be comprised of any appropriate material, as previously explained. Furthermore, an implantation mask 214A may be provided in the form of a resist mask so as to expose the active region 203A, i.e., the mask layer 205 formed thereon, while covering the active region 203B. Moreover, the device 200 is subjected to an ion implantation process 213A designed to introduce a dopant species into the active region 203A, which may be accomplished on the basis of well-established implantation recipes, wherein, however, corresponding process parameters, such as implantation energy and the like, may be appropriately adjusted with respect to the presence of the semiconductor alloy 209 and the mask layer 205. However, typically, both material layers may be provided with a moderately small layer thickness so that a corresponding adaptation may readily be accomplished on the basis of conventional strategies.

Figure 2I:
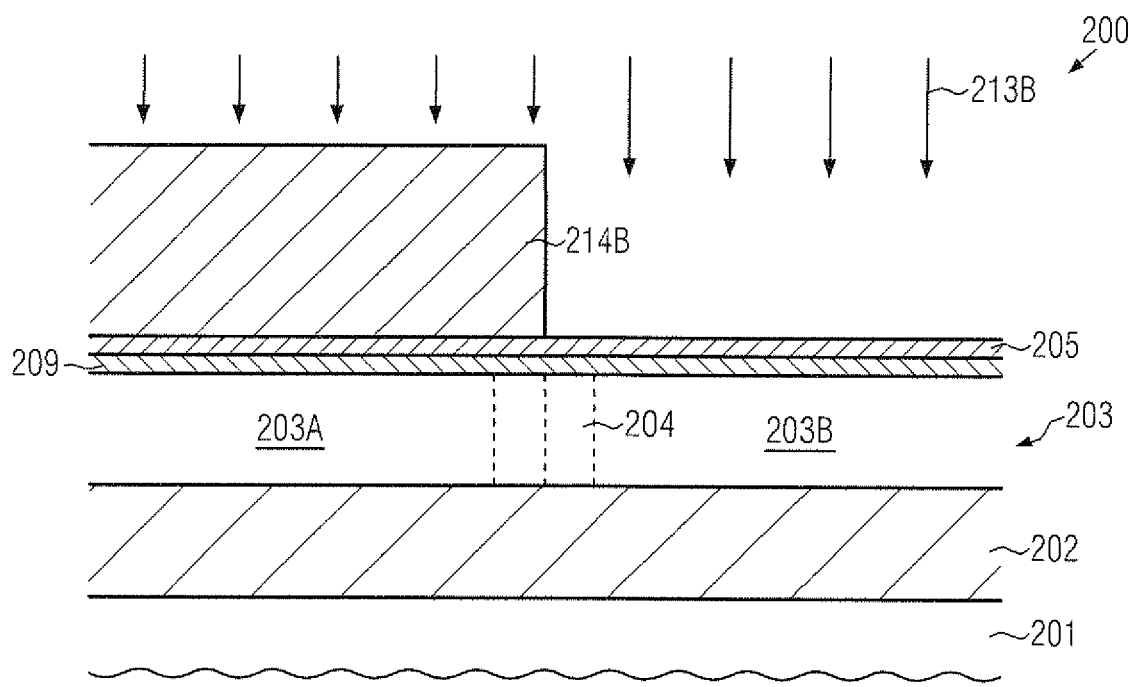

FIG. 2i schematically illustrates the semiconductor device 200 in a further advanced manufacturing stage in which, after removal of the implantation mask 214A (FIG. 2h), a further implantation mask 214B may expose the active region 203B, i.e., the material layers 205, 209 formed thereon, while covering the corresponding material layers formed above the active region 203A. Furthermore, an implantation process 213B may be performed so as to introduce the dopant species into the active region 203B in accordance with the overall device requirement.

Figure 2J:
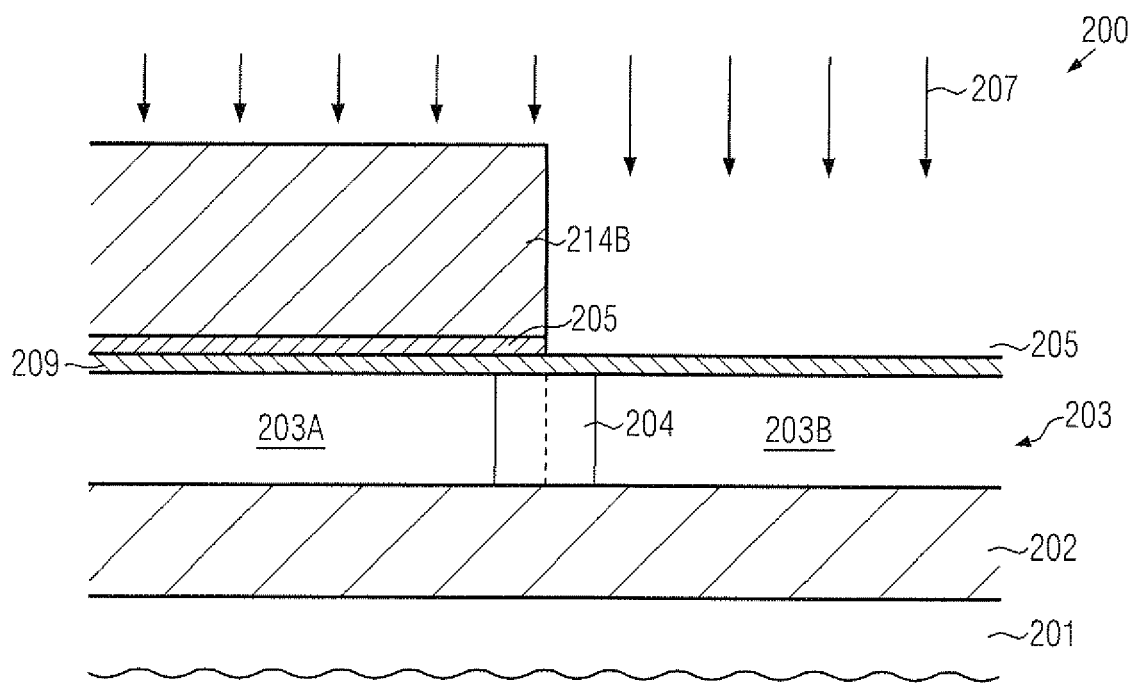

FIG. 2j schematically illustrates the semiconductor device 200 when exposed to the etch ambient 207, for instance provided in the form of a wet chemical etch ambient, in which the mask layer 205 may be patterned on the basis of the implantation mask 214B. Consequently, any additional lithography steps for patterning the mask layer 205 may be avoided, thereby contributing to a very efficient overall process flow.

Figure 2K:
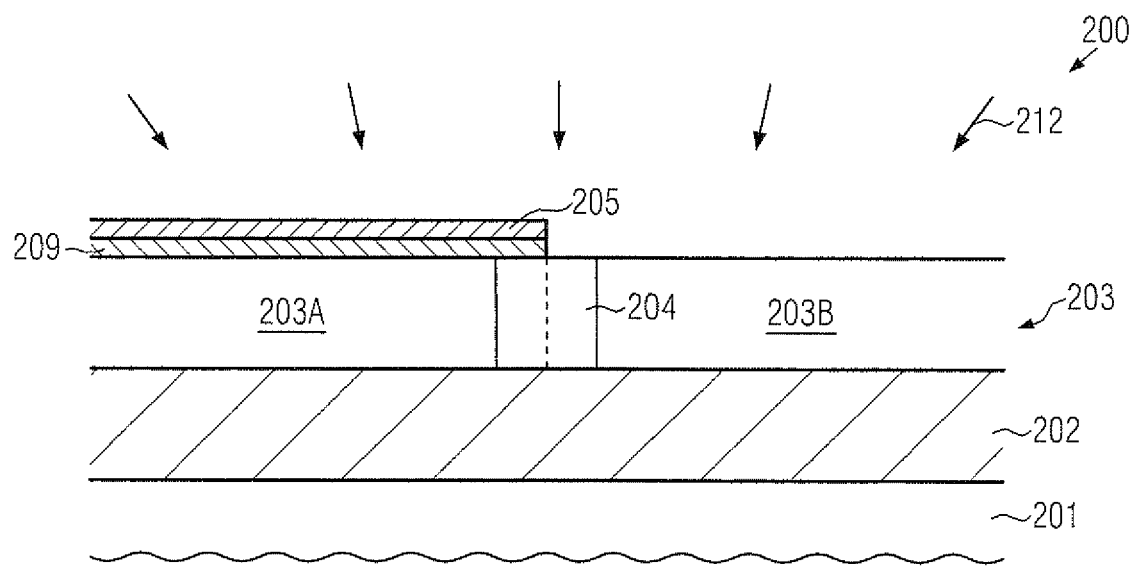

FIG. 2k schematically illustrates the semiconductor device 200 when exposed to the etch ambient 212 for removing the exposed portion of the semiconductor alloy 209 from above the active region 203B on the basis of the mask layer 205. With respect to any process recipes for the etch process 212, the same criteria may apply as previously explained. Also in this case, the semiconductor alloy 209 may be provided with a high degree of uniformity on the basis of the highly efficient manufacturing flow without requiring any additional lithography steps. After the etch process 212, further processing may be continued, as previously described, i.e., the mask layer 205 may be removed and further processing may be continued by forming sophisticated gate electrode structures as is also previously explained with reference to the transistor elements 150A, 150B (FIG. 1d).

Figure 2L:
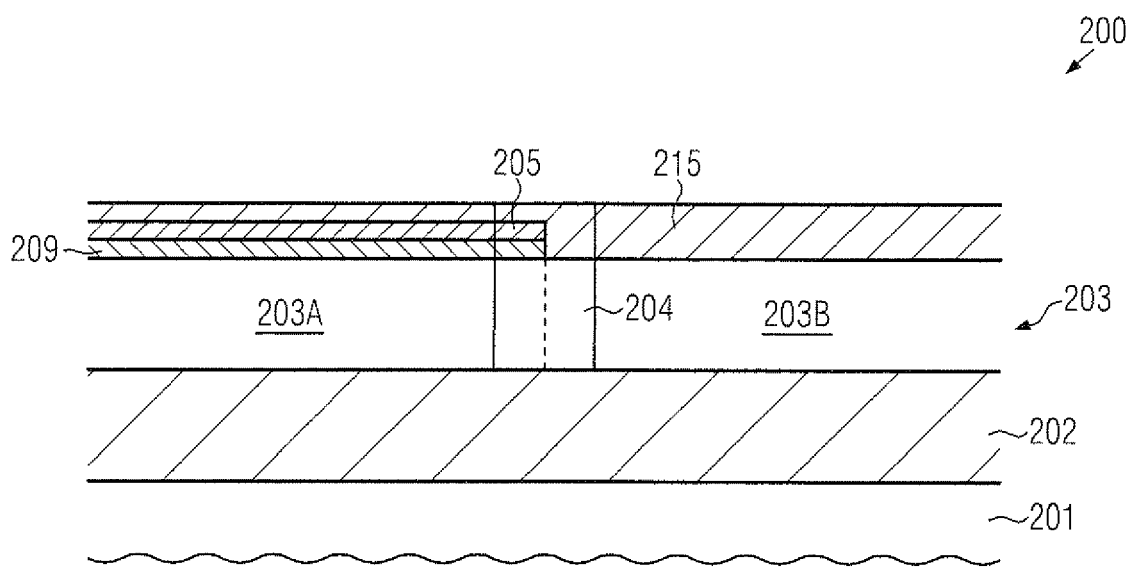
FIG. 2l schematically illustrates the semiconductor device according to an illustrative embodiment in which an isolation structure may be formed after providing the threshold adjusting semiconductor alloy.

FIG. 2l schematically illustrates the semiconductor device 200 according to further illustrative embodiments in which the isolation structure 204 is formed after patterning the semiconductor alloy 209. For example, in the process sequence described above with reference to FIGS. 2g-2k, the semiconductor alloy 209 may be patterned on the basis of an implantation mask prior to forming the isolation structure, while, in other cases, the semiconductor alloy 209 may be patterned after having formed the basic dopant concentration in the regions 203A, 203B, as is described with reference to FIG. 2f. In any of these cases, further processing may be continued on the basis of the remaining portions of the semiconductor alloy 209 and the mask layer 205, which may be maintained to enhance integrity of the material 209 to reduce any process non-uniformities that may exist during the manufacturing sequence for providing the isolation structure 204. In one illustrative embodiment, as illustrated in FIG. 2l, a stop layer 215, i.e., an etch stop material and/or a chemical mechanical polishing (CMP) stop material may be formed, such as a silicon nitride material, which may be deposited on the basis of any appropriate deposition recipe. Depending on the overall process strategy, the surface topography of the device 200 may be planarized, if required, while, in other cases, further processing may be continued on the basis of the layer 215 without further surface treatment. Consequently, the layer 215 may be used as a platform for further processing, i.e., a sequence for defining an etch mask and etching a trench into the semiconductor layer 203 and filling the same on the basis of well-established deposition recipes. Thereafter, any excess material may be removed, for instance by CMP, wherein the layer 215 may act as a stop layer. Thereafter, residues of the layer 215 may be removed, wherein the mask layer 205 may still maintain integrity of the semiconductor alloy 209. Thereafter, the mask layer 205 may be removed, for instance on the basis of any process techniques, as previously described, and thereafter further processing may be continued with forming sophisticated gate electrode structures.

Figure 2M:
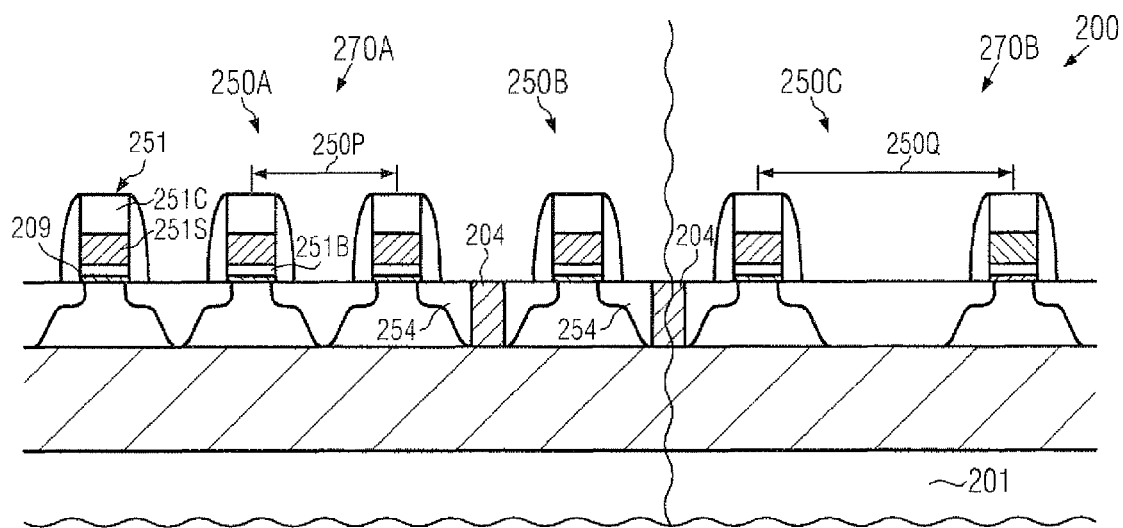
FIG. 2m schematically illustrates a cross-sectional view of the semiconductor device in a further advanced manufacturing stage, in which a plurality of P-channel transistors may have a threshold adjusting semiconductor alloy with a reduced degree of variability with respect to material composition and/or layer thickness, according to illustrative embodiments.

FIG. 2m schematically illustrates the semiconductor device 200 in an advanced manufacturing stage. As illustrated, the device 200 may comprise a first device region 270A including a plurality of first transistors 250A, such as P-channel transistors, and one or more N-channel transistors 250B. Furthermore, a second device region 270B may be provided in which a plurality of third transistors 250C, such as P-channel transistors, may be formed, possibly in combination with one or more N-channel transistors (not shown). In the embodiment shown, the transistors 250A, 250C may represent sophisticated transistor elements having formed therein the threshold adjusting semiconductor alloy 209 in order to provide the desired transistor characteristics, as previously discussed. On the other hand, the transistor 250B may represent a transistor for which a corresponding threshold adjustment on the basis of semiconductor alloy may not be required. The transistors 250A, 250B and 250C may each comprise a gate electrode structure 251, which may in turn comprise a gate insulation layer 251B formed on the basis of a high-k dielectric material, as previously explained. Furthermore, a metal-containing electrode material 251S, such as aluminum oxide, titanium nitride and the like, may be formed on the corresponding gate insulation layers 251B, wherein, if required, an additional electrode material 251C, such as a polysilicon material and the like, may be formed on the electrode material 251S. Furthermore sophisticated drain and source regions 254 may be provided in order to obtain the desired overall transistor characteristics, as also previously discussed.

The transistors 250A, 250B and 250C may be formed on the basis of any appropriate manufacturing strategy, for instance as previously discussed, wherein the enhanced uniformity of the semiconductor alloy 209 in each of the transistors 250A, 250C may provide superior uniformity of the resulting transistor characteristics. For example, in the device region 270A, a distance or pitch 250P between adjacent transistors 250A may correspond to a minimum critical distance in order to obtain a desired high packing density. For example, in sophisticated applications, the pitch 250P may be approximately 100 nm and less, while a gate length, i.e., in FIG. 2M the horizontal extension of the electrode material 251A, may be approximately 50 nm and less. On the other hand, a corresponding distance or pitch 250Q between adjacent transistors 250C may be significantly higher, depending on the overall device requirements, while, nevertheless, the enhanced degree of uniformity of the corresponding semiconductor alloys 209 may provide a reduced transistor variability, irrespective of the corresponding distances 250P, 250Q. As previously explained, this may be accomplished on the basis of enhanced process conditions during the deposition of the semiconductor alloy 209, since, in a local sense, a very similar neighborhood for each of the transistors 250C, 250A may be accomplished. For example, the transistor 250B may represent a "next" neighbor for respective ones of the transistors 250A, 250C, thereby providing a similar local neighborhood during the deposition process for forming the material 209, as previously explained.

As a result, the present disclosure provides semiconductor devices and manufacturing techniques, in which deposition-related non-uniformities for forming a threshold adjusting semiconductor alloy may be reduced by depositing the material on active regions for each type of transistor and subsequently patterning the semiconductor alloy on the basis of a highly controllable patterning sequence. Consequently, sophisticated gate electrode structures including a high-k dielectric material and a metal-containing electrode material may be formed in an early manufacturing stage, i.e., prior to forming drain and source regions, on the basis of a threshold adjusting semiconductor alloy, such as a silicon/germanium material, wherein the enhanced uniformity during the selective formation of the threshold adjusting material may result in a reduced threshold variability, even if extremely scaled semiconductor devices are considered.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a layer of a silicon-containing semiconductor alloy on a first silicon-containing crystalline semiconductor region and a second silicon-containing crystalline semiconductor region;
    removing said layer of silicon-containing semiconductor alloy selectively from said second silicon-containing crystalline semiconductor region;
    forming a first gate electrode structure of a first transistor on said layer of a silicon-containing semiconductor alloy, said first gate electrode structure comprising a high-k dielectric gate insulation layer and a metal-containing gate electrode material formed on said high-k dielectric gate insulation layer;
    forming a second gate electrode structure of a second transistor above said second silicon-containing crystalline semiconductor region, said second gate electrode structure comprising a high-k dielectric gate insulation layer and a metal-containing gate electrode material formed on said high-k dielectric gate insulation layer of said second gate electrode structure; and
    forming source and drain regions of the first and second transistors in the first and second silicon-containing crystalline semiconductor regions, respectively.

2. The method of claim 1, wherein removing said layer of silicon-containing semiconductor alloy comprises forming a hard mask layer selectively above said first silicon-containing crystalline semiconductor region and performing an etch process on the basis of said hard mask layer.

3. The method of claim 2, wherein performing said etch process comprises applying a wet chemical etch recipe.

4. The method of claim 3, wherein performing said etch process comprises applying a wet chemical etch recipe on the basis of tetra methyl ammonia hydroxide (TMAH).

5. The method of claim 2, further comprising performing a further etch process to remove said hard mask layer.

6. The method of claim 1, wherein forming said layer of silicon-containing semiconductor alloy comprises performing a selective epitaxial growth process to suppress material deposition on an isolation structure that laterally separates said first and second silicon-containing crystalline semiconductor regions.

7. The method of claim 1, further comprising forming an isolation structure prior to forming said layer of silicon-containing semiconductor alloy, wherein said isolation structure laterally separates said first and second silicon-containing crystalline semiconductor regions.

8. The method of claim 1, further comprising forming an isolation structure after forming said layer of silicon-containing semiconductor alloy, wherein said isolation structure laterally separates said first and second silicon-containing crystalline semiconductor regions.

9. The method of claim 1, further comprising introducing a first dopant species in said first silicon-containing crystalline semiconductor region and a second dopant species in said second silicon-containing crystalline semiconductor region after forming said layer of silicon-containing semiconductor alloy.

10. The method of claim 9, further comprising forming a mask layer above said layer of silicon-containing semiconductor alloy prior to introducing said first and second dopant species.

11. The method of claim 10, further comprising removing said mask layer from above said second silicon-containing crystalline semiconductor region by etching said mask layer through an implantation mask used for introducing said first dopant species.

12. The method of claim 11, further comprising forming an isolation structure laterally between said first and second silicon-containing crystalline semiconductor regions prior to forming said layer of silicon-containing semiconductor alloy.

13. The method of claim 11, further comprising forming an isolation structure laterally between said first and second silicon-containing crystalline semiconductor regions after forming said layer of silicon-containing semiconductor alloy.

14. The method of claim 1, wherein said semiconductor alloy comprises a silicon/germanium alloy.

15. A method, comprising:
    forming a threshold adjusting semiconductor material on first and second silicon-containing semiconductor regions;

introducing a dopant species in said second silicon-containing semiconductor region by using an implantation mask covering said first silicon-containing semiconductor region;

removing said threshold adjusting semiconductor material selectively from said second silicon-containing semiconductor region by etching said threshold adjusting semiconductor material through said implantation mask;

forming a first gate electrode structure of a first transistor on said threshold adjusting semiconductor material and a second gate electrode structure of a second transistor on said second silicon-containing semiconductor region, said first and second gate electrode structures comprising a high-k dielectric material and a metal-containing electrode material formed on said high-k dielectric material; and forming source and drain regions of the first and second transistors in the first and second silicon-containing crystalline semiconductor regions, respectively.

16. The method of claim 15, wherein removing said threshold adjusting semiconductor material selectively from said second silicon-containing semiconductor region comprises forming a mask layer, patterning said mask layer by using said implantation mask and etching said threshold adjusting semiconductor material by using said patterned mask layer as an etch mask.

17. The method of claim 16, wherein etching said threshold adjusting material comprises performing a wet chemical etch process.

18. The method of claim 17, wherein said wet chemical etch process is performed on the basis of tetra methyl ammonia hydroxide (TMAH).

19. The method of claim 15, further comprising forming an isolation structure laterally between said first and second silicon-containing semiconductor regions prior to forming said threshold adjusting semiconductor material.

20. The method of claim 15, further comprising forming an isolation structure laterally between said first and second silicon-containing semiconductor regions after forming said threshold adjusting semiconductor material.

21. The method of claim 15, wherein said threshold adjusting semiconductor material comprises a silicon/germanium alloy.

22. A semiconductor device, comprising:

a first device region comprising a plurality of densely packed first P-channel transistors defining a pitch of approximately 100 nm or less, each of said first P-channel transistors being formed in and above a first silicon-containing semiconductor region and comprising a first layer of a threshold adjusting semiconductor alloy in a channel region of each of said first P-channel transistors, wherein source and drain regions of each of said first P-channel transistors are formed in the first silicon-containing semiconductor region; and a second device region comprising a plurality of second P-channel transistors defining a pitch of more than 100 nm, each of said second P-channel transistors being formed in and above a second silicon-containing semiconductor region and comprising a second layer of said threshold adjusting semiconductor alloy in a channel region of each of said second P-channel transistors, wherein a first degree of uniformity of at least one of a material composition and a layer thickness of said first layer of said threshold adjusting semiconductor alloy is less than or substantially equal to plus/minus 2 percent, and wherein a second degree of uniformity of at least one of a material composition and a layer thickness of said second layer of said threshold adjusting semiconductor alloy is less than or substantially equal to plus/minus 2 percent, wherein source and drain regions of each of said second P-channel transistors are formed in the second silicon-containing semiconductor region.

23. The semiconductor device of claim 22, wherein said gate electrode structures of said first and second P-channel transistors comprise a high-k dielectric material formed above said first and second layers of threshold adjusting semiconductor material, respectively, and a metal-containing electrode material formed on said high-k dielectric material.

24. The semiconductor device of claim 22, wherein a target thickness of said layer of threshold adjusting semiconductor material is approximately 10 nm or less.

25. The semiconductor device of claim 24, wherein said threshold adjusting semiconductor material comprises a silicon/germanium alloy with a germanium concentration of approximately 20 atomic percent or more.

* * * * *